(12) United States Patent
Wang

(10) Patent No.: US 8,048,617 B2
(45) Date of Patent: Nov. 1, 2011

(54) METHOD FOR MANUFACTURING PATTERNED THIN-FILM LAYER

(75) Inventor: Yu-Ning Wang, Hsinchu (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 483 days.

(21) Appl. No.: 11/959,127

(22) Filed: Dec. 18, 2007

(65) Prior Publication Data
US 2008/0261160 A1    Oct. 23, 2008

(30) Foreign Application Priority Data
Apr. 20, 2007   (TW) ............................... 96113927 A

(51) Int. Cl.
*G03F 7/26*   (2006.01)
(52) U.S. Cl. ........................................ 430/324
(58) Field of Classification Search ................. 430/322, 430/328, 324
See application file for complete search history.

(56) References Cited

U.S. PATENT DOCUMENTS

| | | | |
|---|---|---|---|
| 2001/0006761 A1* | 7/2001 | Golz et al. | 430/311 |
| 2002/0008916 A1* | 1/2002 | Nishikawa et al. | 359/619 |
| 2004/0247790 A1* | 12/2004 | Moriyama | 427/256 |

FOREIGN PATENT DOCUMENTS

| | | |
|---|---|---|
| TW | 200404183 | 3/2004 |
| TW | I228178 | 2/2005 |
| TW | 200619690 | 6/2006 |

\* cited by examiner

*Primary Examiner* — Kathleen Duda
*Assistant Examiner* — Brittany Raymond
(74) *Attorney, Agent, or Firm* — Altis Law Group, Inc.

(57) ABSTRACT

A method for manufacturing a patterned thin-film layer according to one preferred embodiment includes the steps of: providing a substrate with a plurality of banks thereon, the plurality of banks defining a plurality of spaces therein for receiving ink therein, each of the banks having a top surface and a plurality of side surfaces adjacent to the top surface; irradiating the plurality of banks with UV light beams, wherein the UV light beams are obliquely incident on the top surfaces of the substrate such that a surface wettability of the ink on the top surfaces is lower than that of the side surfaces of the banks; applying ink into the spaces; and curing the ink so as to form a patterned thin-film layer on the substrate.

14 Claims, 10 Drawing Sheets

METHOD FOR MANUFACTURING PATTERNED THIN-FILM LAYER

CROSS-REFERENCE TO RELATED APPLICATIONS

This application claims all benefits accruing under 35 U.S.C. §119 from Taiwan Patent Application No. 096113927, filed on Apr. 20, 2007 in the Taiwan Intellectual Property Office, the disclosure of which is incorporated herein by reference.

BACKGROUND OF THE INVENTION

1. Field of the Invention

The present invention generally relates to a method for manufacturing patterned thin-film layer on a substrate.

2. Description of related art

At present, methods for manufacturing a patterned thin-film layer on a substrate include photolithographic method and ink-jet method.

The photolithographic method is described as below: applying a photoresist layer on a substrate; exposing the photoresist layer using a photo mask with a predetermined pattern and developing the exposed photoresist layer using the conventional method to form a predetermined patterned thin-film layer. Disadvantage of the conventional photolithographic method is that a large part of the photoresist material is wasted thus, the efficiency is lowered.

Referring to FIG. 10, the ink-jet method includes following steps: Referring to FIG. 10(a), a substrate 42 with a plurality of banks 44 is provided, wherein the plurality of banks 44 defining a plurality of spaces 46 therebetween; the banks 44 is irradiated by ultraviolet (UV for short hereinafter) light beams 48 in a direction perpendicularly to the top surface of the banks 44. Referring to FIGS. 10(b) and 10(c), drops of ink 54 are dripped into the spaces 46 via a nozzle 52 in a manner such that the ink of a same material applied in the spaces 46 in a same row. A patterned thin-film layer (not shown) is formed after curing the ink 54.

In FIG. 10(a), the UV light beams 48 decomposes non-hydrophile substance, and thus increase the surface wettability of the top surface of the banks 44. When a material of the banks 44 is an organic material, the UV light beams 48 can break the unsaturated links of the organic material adjacent of the outer surface of the banks 44, which further increases the surface wettability of the top surface of the banks 44. In FIG. 10(c), because the UV light beams perpendicularly irradiate the top surface of banks 44, the top surface of which has better surface wettability than the side surface thereof. Therefore, when an ink 542 applied in a space 46 overflows to the top surface of the bank 44, the ink 542 is prone to flow along the top surface of the bank 44 and mixed with an ink 544 adjacent to the ink 542. This may reduce purity of the ink in the same space.

What is needed, therefore, is a method for manufacturing a patterned thin-film layers with high purity of the ink in the same space.

SUMMARY OF THE INVENTION

A method for manufacturing a patterned thin-film layer according to one present embodiment includes the steps of: providing a substrate with a plurality of banks thereon, the plurality of banks defining a plurality of spaces therein for receiving ink therein, each of the banks having a top surface and a plurality of side surfaces adjacent to the top surface; irradiating the plurality of banks with UV light beams, wherein the UV light beams are obliquely incident on the top surfaces of the substrate such that a surface wettability of the ink on the top surfaces is lower than that of the side surfaces of the banks; applying ink into the spaces; and curing the ink so as to form a patterned thin-film layer on the substrate.

Advantages and novel features will become more apparent from the following detailed description of the present method for manufacturing patterned thin-film layer when taken in conjunction with the accompanying drawings.

BRIEF DESCRIPTION OF THE DRAWINGS

Many aspects of the present method for manufacturing patterned thin-film layer can be better understood with reference to the following drawings. The components in the drawings are not necessarily drawn to scale, the emphasis instead being placed upon clearly illustrating the principles of the present method for manufacturing patterned thin-film layer. Moreover, in the drawings, like reference numerals designate corresponding parts throughout the several views.

Figure 1:
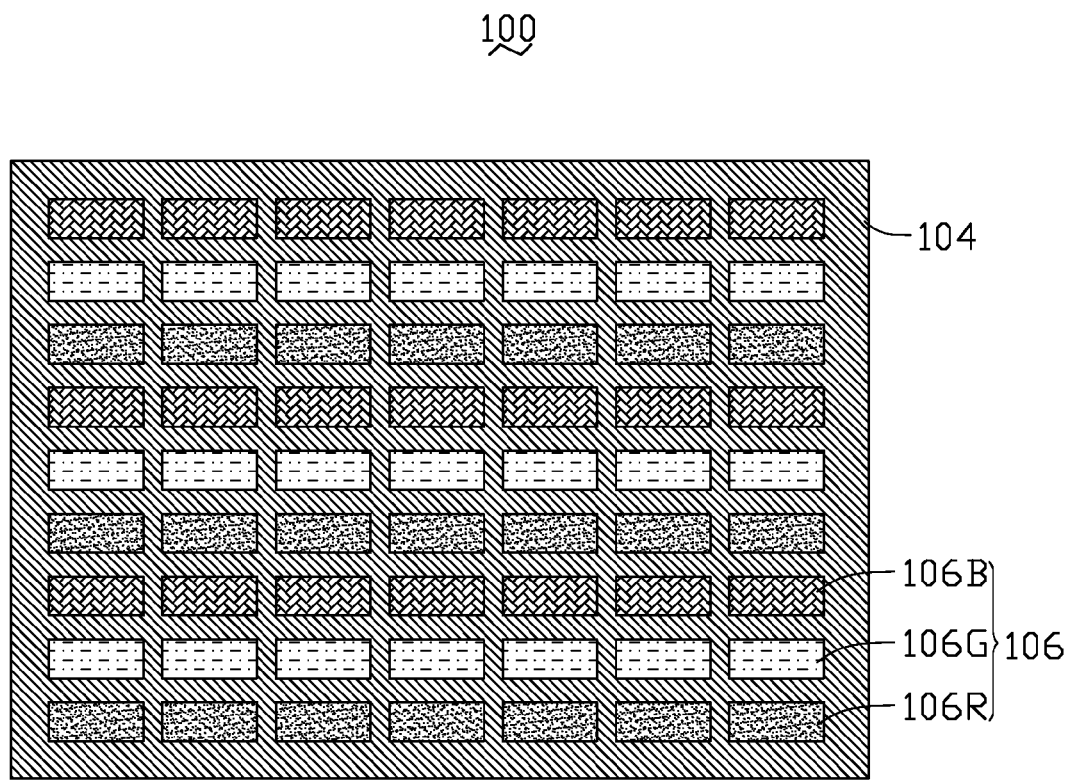
FIG. 1 is a cross-sectional view of a patterned thin-film layer in accordance with a first embodiment.

Corresponding reference characters indicate corresponding parts throughout the drawings. The exemplifications set out herein illustrate at least one preferred embodiment of the present method for manufacturing patterned thin-film layer, in one form, and such exemplifications are not to be construed as limiting the scope of the invention in any manner.

DETAILED DESCRIPTION OF THE INVENTION

Reference will now be made to the drawings to describe preferred embodiments of the present UV light source and method for manufacturing patterned thin-film layer using same, in detail.

Figure 2:
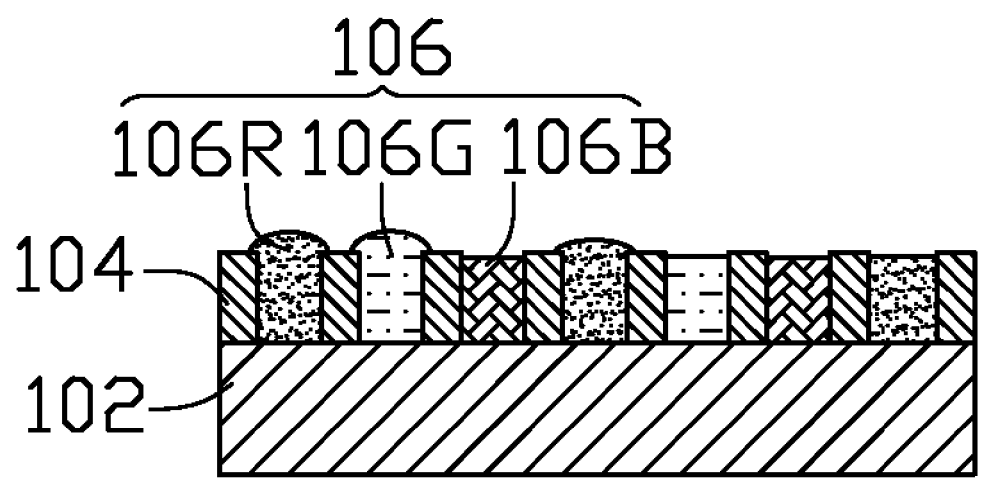
FIG. 2 is another cross-sectional view of a patterned thin-film layer of FIG. 1, showing thickness of thin-film layers.

Referring to FIGS. 1 and 2, a patterned thin-film layer 100 in accordance with a first embodiment is shown. The patterned thin-film layer 100 includes a substrate 102, a plurality of banks 104 formed on the substrate 102 and a patterned thin-film layer 106. In the present embodiment, the patterned thin film layer 100 is a color filter.

A material of the substrate 102 is selected from the group consisting of glass, quartz glass, silicon wafer, metal and plastic. The plurality of banks 104 defines a plurality of spaces therebetween, and the spaces are arranged in rows and columns on the patterned thin-film layer. The patterned thin-film layer 106 in each row are made of a same material, and the patterned thin-film layer 106 in every three rows include a first thin-film layers 106R, a second thin-film layers 106G and a third thin-film layers 106B arranged in a repeating order. The first thin-film layers 106R, the second thin-film layers 106G and the third thin-film layers 106B are respectively red, green and blue thin-film layers.

Figure 3:
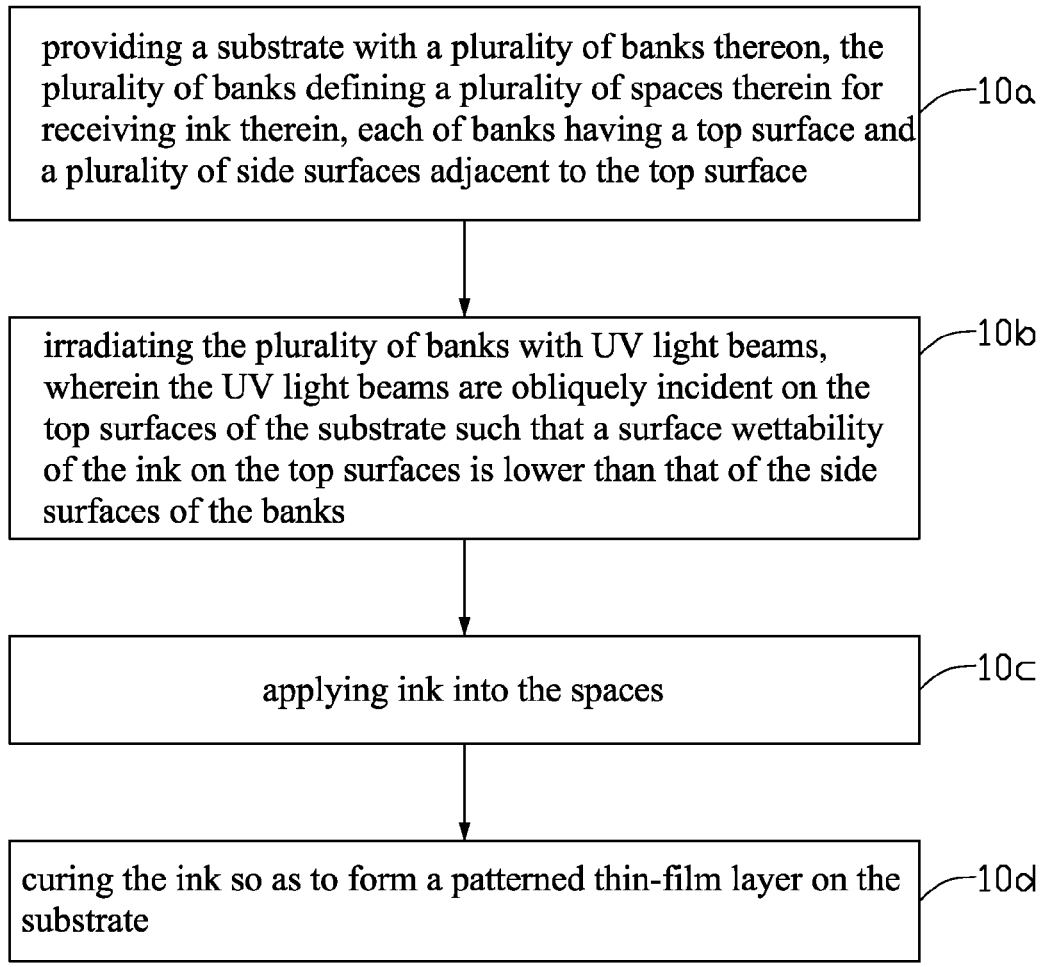
FIG. 3 is a flow chart of a method for manufacturing a patterned thin-film layer in accordance with a second embodiment.

Referring to FIG. 3, a flow chart of a method for manufacturing a patterned thin-film layer in accordance with a second present embodiment is shown. The method mainly includes the steps of: (10a) providing a substrate with a plurality of banks thereon, the plurality of banks defining a plurality of spaces therein for receiving ink therein, each of banks having a top surface and a plurality of side surfaces adjacent to the top surface; (10b) irradiating the plurality of banks with UV light beams, wherein the UV light beams are obliquely incident on the top surfaces of the substrate such that a surface wettability of the ink on the top surfaces is lower than that of the side surfaces of the banks; (10c) applying ink into the spaces; and (10d) curing the ink so as to form a patterned thin-film layer on the substrate.

In step 10a, a material of the substrate is selected from the group consisting of glass, quartz glass, silicon wafer, metal and plastic. In the present embodiment, the substrate is a glass substrate.

Figure 4:
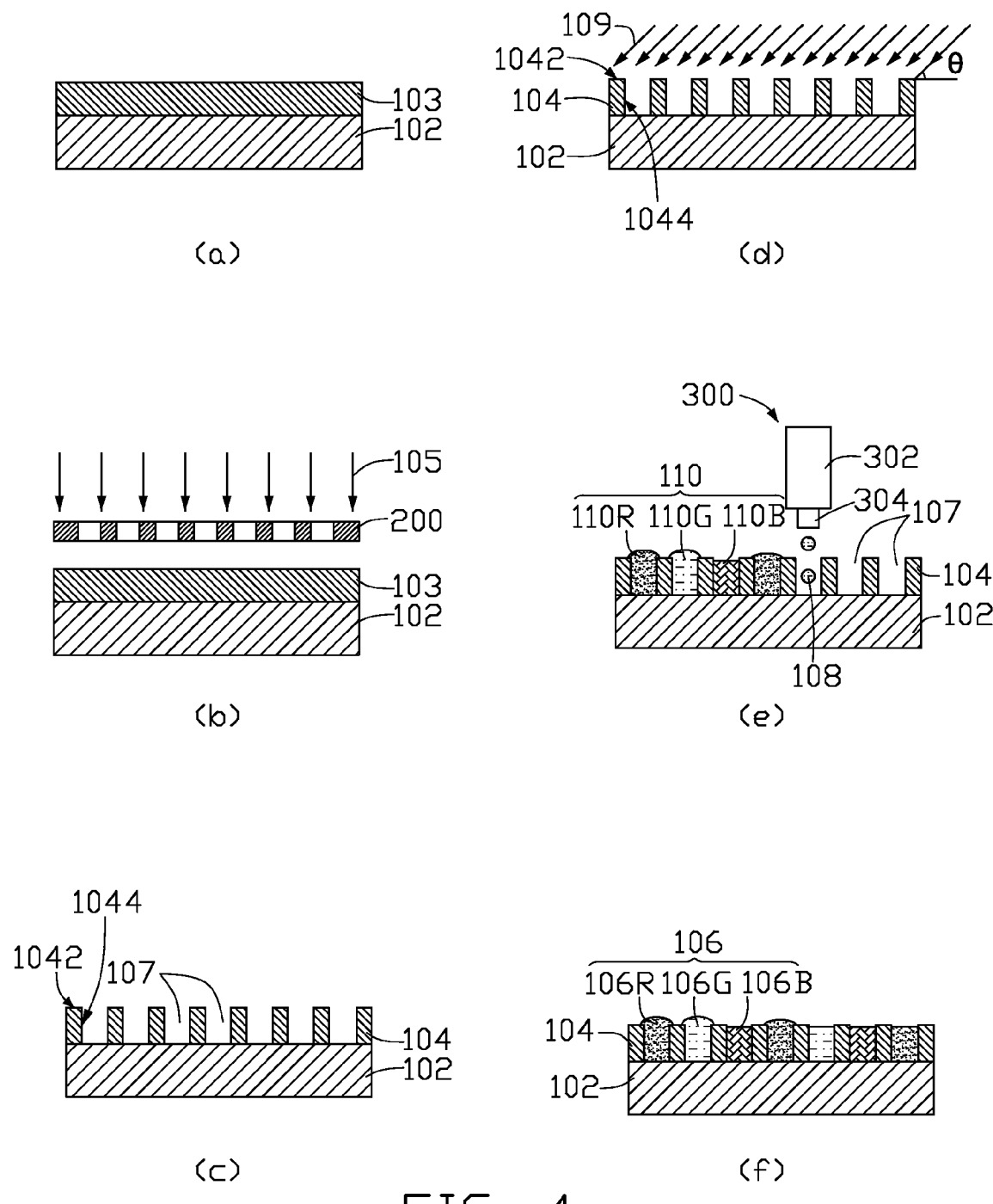
FIGS. 4a to 4f illustrate a manufacturing method of a patterned thin-film layer in accordance with the second embodiment.

With reference to FIGS. 4(a) to 4(c), a method for manufacturing a substrate 102 with a plurality of banks 104 by a photolithography process is described in more detail below.

Referring to FIG. 4(a), a positive-type photoresist layer 103 is applied on a surface of the substrate 102 by slit coating, spin coating, slit-spin coating or dry film lamination.

Referring to FIG. 4(b), the positive-type photoresist layer 103 is exposed using a photo mask 200 disposed between the positive-type photoresist layer 103 and a light-exposure device (not shown). The photo mask 200 has a predetermined pattern. The light-exposure device may be an UV light source. The light-exposure device emits light beams 105 to expose the positive-type photoresist layer 103.

Referring to FIG. 4(c), the exposed parts of the positive-type photoresist layer 103 is removed by a developing process to form a patterned photoresist layer serving as the plurality of banks 104. Each bank 104 has a top surface 1042 and a plurality of side surfaces 1044 adjacent to the top surface 1042.

Referring to FIG. 4(d), in step 10b, UV light beams 109 are emitted from a UV light source (not shown) and irradiate the banks 104. The light beams 109 are obliquely incident on the top surfaces 1042 at oblique angle $\theta$ in a range from $3°<\theta<80°$, and preferably $5°<\theta<35°$.

Referring to FIG. 4(e), in step 10c, ink 108 of a desired material is applied into the spaces 107 to form ink layers 110 using an ink-jet device 300. The ink-jet device 300 includes at least one ink-jet head 302 with at least a nozzle 304 formed thereon. The ink-jet device 300 can be either a thermal bubble ink-jet device or a piezoelectrical ink-jet device. The ink layers 110 applied in every three rows comprises a first ink layer 110R, a second ink layer 110G and a third ink layer 110B arranged in a repeating order. Wherein first ink layer 110R, the second ink layer 110G and the third ink layer 110B are respectively red, green, blue ink layers.

Referring to FIGS. 4(e) and 4(f), in step 10d, the ink layers 110 in the spaces 107 are cured by a curing device (not shown), such as a heating device or an ultraviolet light source, so as to form a patterned thin-film layer 106. The patterned thin-film layer 106 includes a first thin-film layer 106R, a second thin-film layer 106G, and a third thin-film layer 106B corresponding to the first ink layer 110R, the second ink layer 110G and the third ink layer 110B respectively. A heating device and a vacuum-pumping device can also be used for curing the ink layers 110 defined by the banks 104.

Referring to FIGS. 4(d) and 4(e), the light beams 109 inclines at an oblique angle in a range of $0°<\theta<90°$ to the top surfaces 1042. Therefore, less light energy is received by the top surfaces 1042 of the banks 104 than the side surfaces 1044 of the banks 104 and the surface of the substrate, comparing with irradiating the top surfaces 1042 perpendicularly to the top surfaces 1042. Thus surface wettability of the top surface 1042 is weaker than that of the side surfaces 1044 of banks 104 and the surface of the substrate 102. When the first ink layer 110R overflows to the top surface 1042, the first ink layer 110R having a higher surface tension and weaker surface wettability is not prone to flowing to the adjacent second ink layer 110G. This may prevent adjacent ink layers from mixing.

The method in accordance with the present embodiment can be used in manufacturing items such as color filters or organic light-emitting diodes. In manufacturing a color filter, the patterned thin films can be three-primary-color colored layers. In manufacturing an organic light-emitting diode, the patterned thin films can be conductive layers, light-emitting layers, electron-transmission layers or hole-transmission layers.

Figure 5:
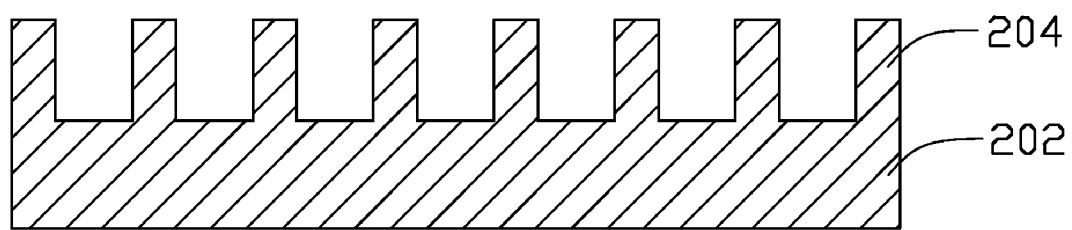
FIG. 5 is a cross-sectional view of a substrate in accordance with a third embodiment.

In addition, the plurality of banks 104 and the substrate 102 may also be integrally molded using an injection molding process in accordance with a third present embodiment, as shown in FIG. 5. For example, a mold insert with a predetermined pattern corresponding to the patterned thin-film layer 106 received into a mold. A molten material of the substrate is injected into the mold. After being cooled, the molded substrate is removed from the mold. Then a substrate 202 with a plurality of banks 204 thereon is formed.

Figure 6:
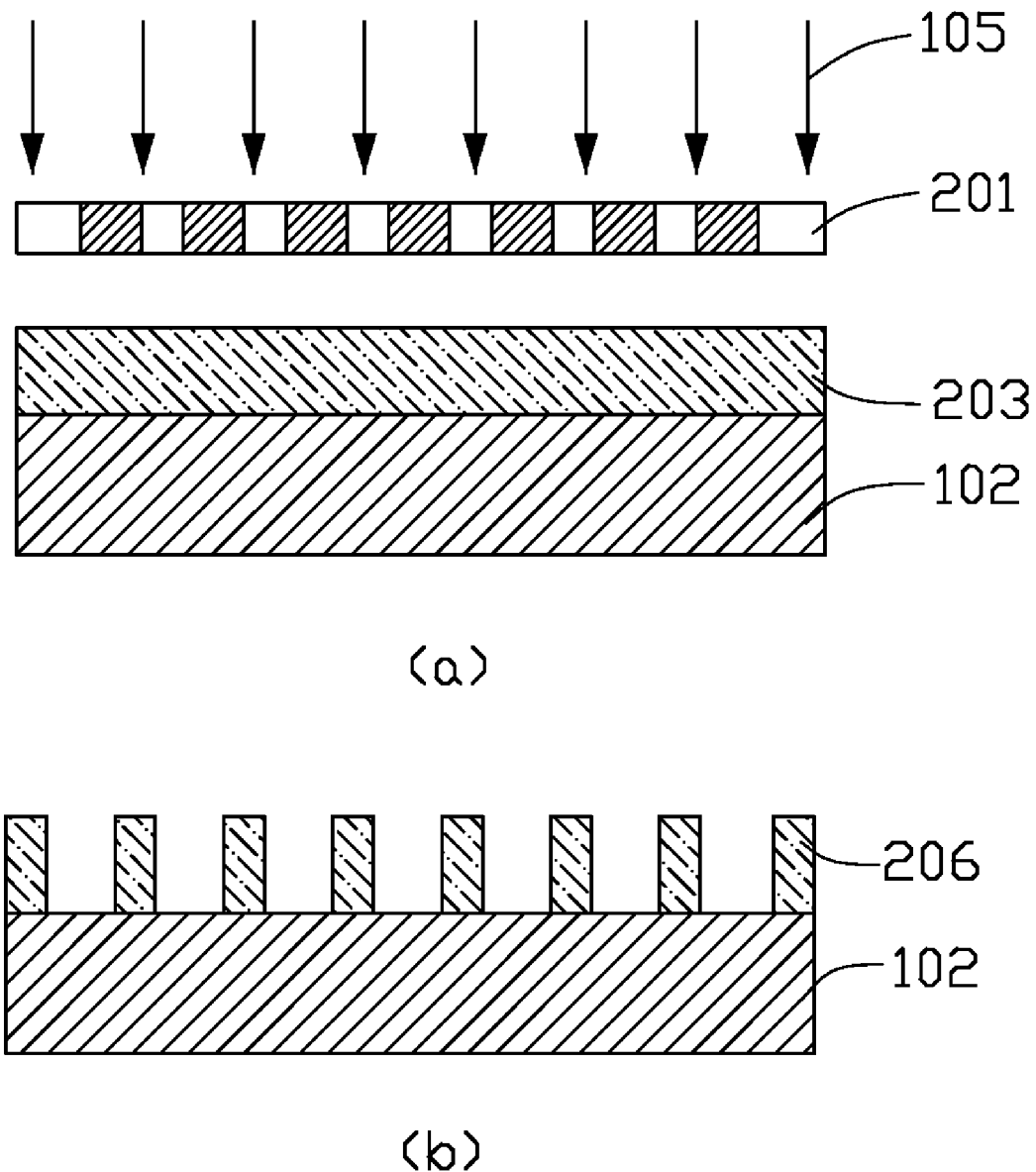
FIGS. 6a to 6b illustrate a method for manufacturing banks on a substrate in accordance with a fourth embodiment.

Besides, referring to FIG. 6(a) to FIG. 6(b), another method for manufacturing the substrate 102 with a plurality of banks 206 is illustrated in accordance with a fourth present embodiment. The method is described in more detail below. With reference to FIG. 6(a), a negative-type photoresist layer 203 is applied on a surface of the substrate 102. The negative-type photoresist layer 203 is exposed using a photo mask 201 disposed between the negative-type photoresist layer 103 and UV light beams 105. The photo mask 201 has a predetermined pattern for the patterned thin-film layer. Referring to FIG. 6(b), unexposed parts of the negative-type photoresist layer 203 is removed by a developing process. Then a patterned photoresist layer, which serves as the plurality of banks 204, is formed.

Figure 7:
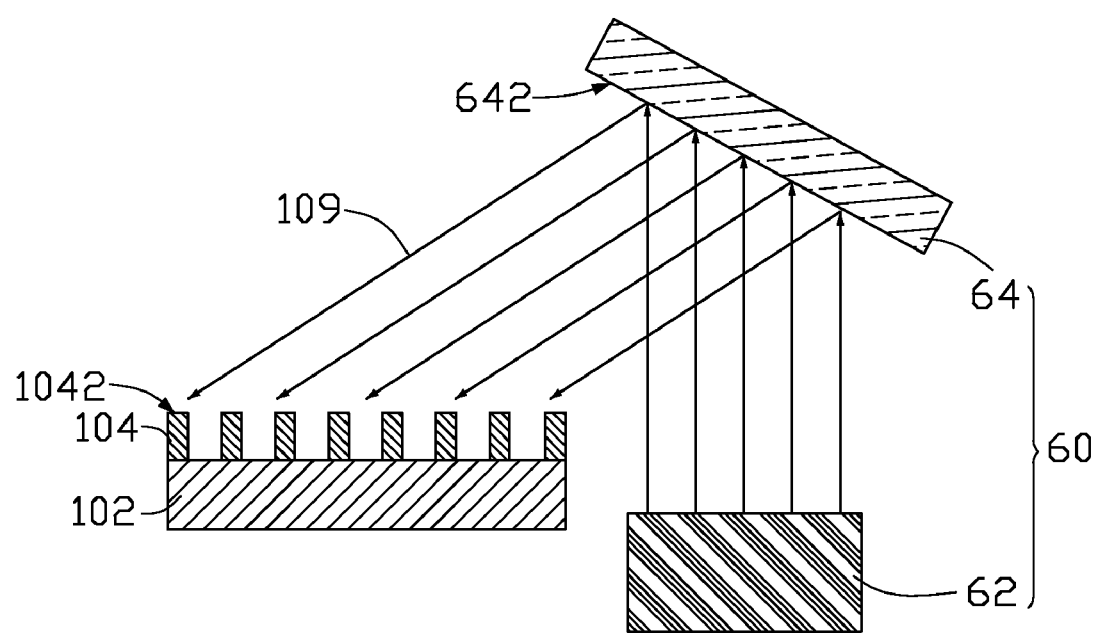
FIG. 7 is a cross-sectional view of a UV light source in accordance with a fifth embodiment.

Referring to FIG. 7, a UV light source device 60 is illustrated in accordance with a fifth present embodiment. The UV light source device 60 is configured for emitting light beams 109 inclined at an angle lower than 90° with respect to the top surfaces of 1042 of the banks 104. The UV light source device 60 includes a light source 62 and a reflector 64. The light source 62 and the reflector 64 are located at one side of the substrate 102. The reflector 64 has a reflection surface 642. The reflection surface 642 of the reflector 64 inclines with respect to the top surface 1042 of the substrate 102. The UV light source 62 emits light beams 109 perpendicular to the top surface of the banks 104, and the light beams 109 are reflected by the reflection surface 642 to the banks 104 on the substrate 102.

Figure 8:
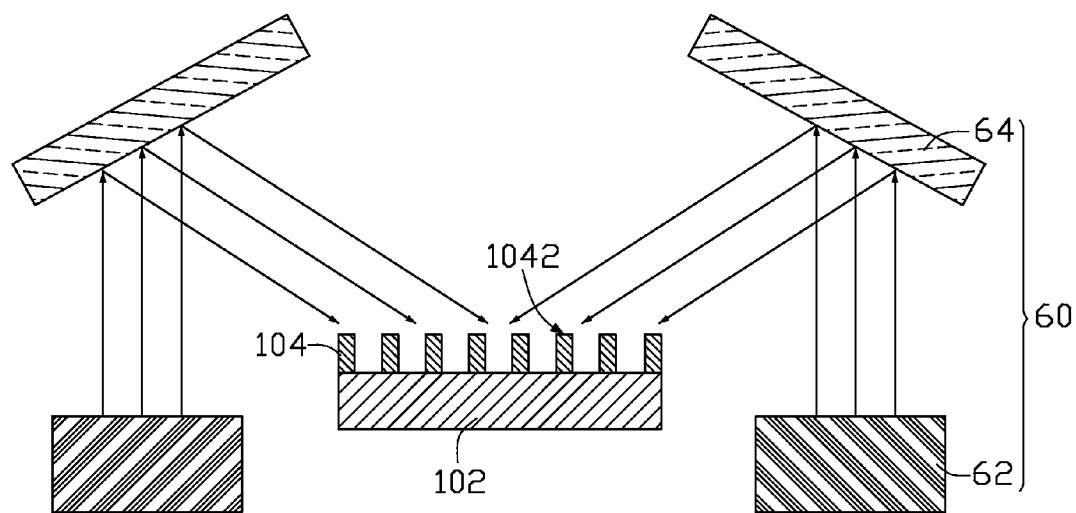
FIG. 8 is a cross-sectional view of another UV light source in accordance with a sixth embodiment.

Referring to FIG. 8, two UV light source devices 60 are provided in accordance with a sixth present embodiment. The two UV light source devices 60 is configured to emit light beams 109 inclined with respect to the top surfaces of 1042 of the banks 104. The two UV light source devices 60 are disposed at the two opposite sides of the substrate 102. It is to be understood that the number of the UV light source device 60 also can be more than two, and still be within the scope of the present embodiment.

Figure 9:
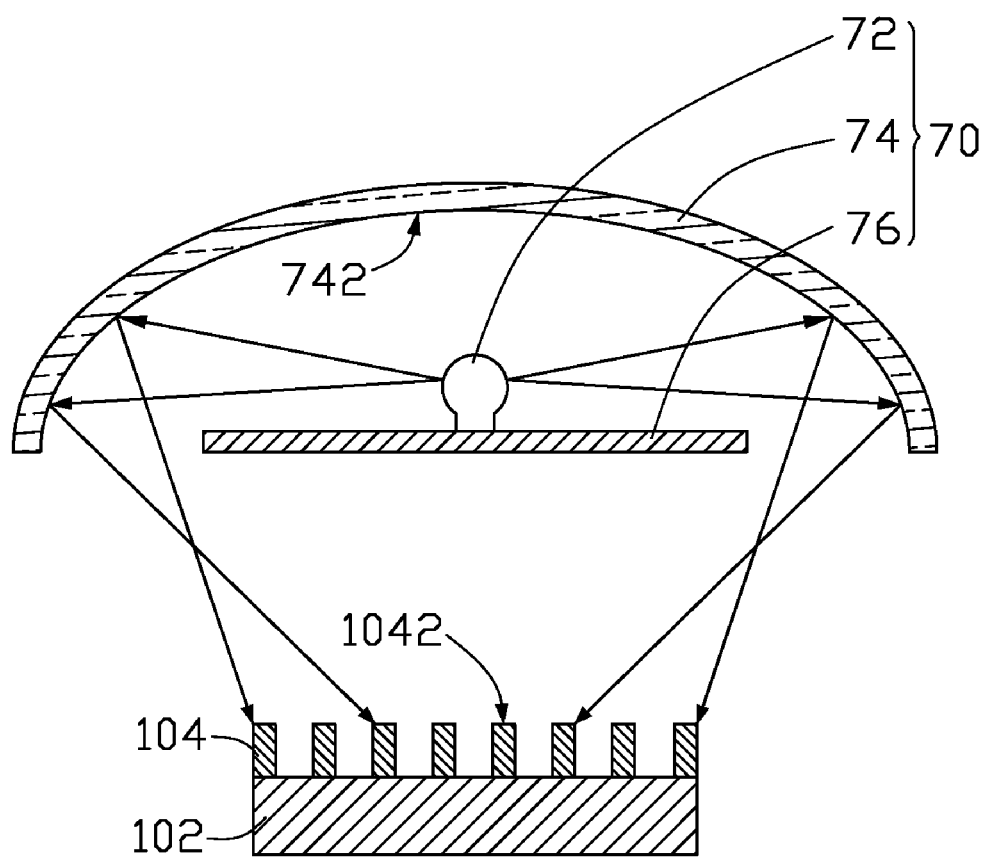
FIG. 9 is a cross-sectional view of another UV light source in accordance with a seventh embodiment.
Figure 10:
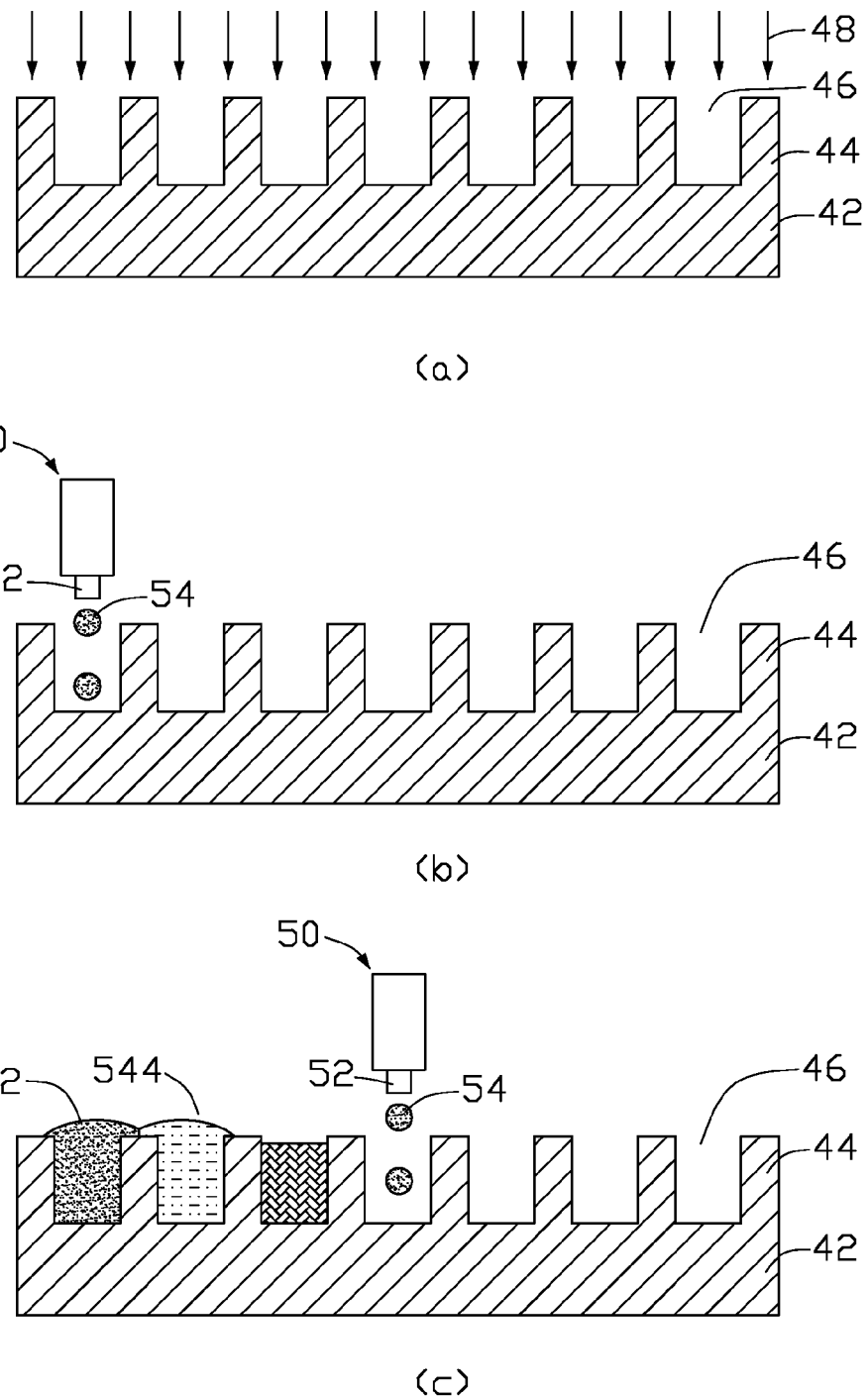
FIG. 10a to 10c illustrate a conventional method for manufacturing a patterned thin-film layer.

Referring to FIG. 9, a UV light source device 70 is illustrated in accordance with a seventh present embodiment. The UV light source device 70 includes a UV light source 72, a reflector 74 and a light screen 76. The reflector 74 includes a reflection surface 742, which faces the substrate 102 and the banks 102. The reflection surface 742 of the reflector 74 is arc-shaped. The UV light source 72 is located between the reflector 74 and the banks 104, and the light screen 76 is located between the UV light source 72 and the banks 104. The light screen 76 is configured for blocking the light emitted from the UV light source 72. The light screen 76 has a size equal to or larger than the substrate 102. The reflector 74 mantles over the light screen 76. The reflection surface 742 of the reflector 74 is configured for reflecting the light beams 78 to the banks 104. The light screen 76 is configured for obstructing light beams 78 emitted from the UV light source 72 or reflected by the reflection surface 742 from being irradiated perpendicularly. Thus, the incidence light on the banks 104 inclines at an angle lower than 90° with respect to the top surfaces 1042 of the blanks 104.

The light source devices in the fifth to seventh embodiment can provide light beams inclined with respect to the top surfaces 1042 of the banks 104. Therefore, less light energy is received by the top surfaces 1042 of the banks 104 than the side surfaces 1044 of the banks 104 and the surface of the substrate, comparing with irradiating the top surfaces 1042 perpendicularly to the top surfaces 1042. Thus surface wettability of the top surface 1042 is weaker than that of the side surfaces 1044 of banks 104 and the surface of the substrate 102. When the first ink layer 110R overflows to the top surface 1042, the first ink layer 110R has a higher surface tension and weaker surface wettability is not prone to flowing to the adjacent second ink layer 110G. This may prevent adjacent ink layers from mixing.

It is to be understood that the above-described embodiment is intended to illustrate rather than limit the invention. Variations may be made to the embodiment without departing from the spirit of the invention as claimed. The above-described embodiments are intended to illustrate the scope of the invention and not restrict the scope of the invention.

What is claimed is:

1. A method for manufacturing a patterned thin-film layer, comprising the steps of:
   providing a substrate with a plurality of banks thereon, the plurality of banks defining a plurality of spaces therein for receiving ink therein, each of the banks having a top surface and a plurality of side surface adjacent to the top surface;
   irradiating the plurality of banks with UV light beams to increase a surface wettability of the banks, wherein the UV light beams are emitted along a direction perpendicular to the top surface of the banks and then reflected by a reflector to be obliquely incident on the top surfaces of the banks, and less light energy is received by the top surfaces than the side surfaces, comparing with irradiating the top surfaces perpendicularly to the top surfaces, such that the surface wettability of the top surfaces is lower than that of the side surfaces of the banks;
   applying ink into the spaces to form a plurality of ink layers, and when a first ink layer overflows to the top surface of the banks, the first ink layer having a higher surface tension and weaker surface wettability is not prone to flow to an adjacent second ink layer, thereby preventing adjacent ink layers from mixing; and
   curing the ink so as to form a patterned thin-film layer on the substrate.

2. The method as claimed in claim 1, wherein the UV light beams are incident on the top surfaces of the banks at an oblique angle in a range from 3° to 80°.

3. The method as claimed in claim 1, wherein the UV light beams are incident on the top surfaces of the banks at an oblique angle in a range from 5° to 35°.

4. The method as claimed in claim 1, wherein the method for manufacturing
   the plurality of banks comprises the steps of:
   applying a photoresist layer on the substrate;
   exposing the photoresist layer; and
   developing the photoresist layer to form a patterned photoresist layer serving as the plurality of banks 5. The method as claimed in claim 1, wherein a method for manufacturing the plurality of banks comprises the steps of:
   providing an injection mold machine, and a mold with a predetermined bank pattern;
   injecting a material of the substrate into the mold using the injection mold machine;
   demoulding the mold to form the substrate with the plurality of banks.

6. The method as claimed in claim 1, wherein a material of the substrate is selected from the group consisting of glass, quartz glass, silicon wafer, metal and plastic.

7. The method as claimed in claim 1, wherein the ink is applied in the spaces using an ink-jet device, and the ink-jet device comprises an ink-jet head and at least a nozzle on the ink-jet head.

8. The method as claimed in claim 7, wherein the ink jet device is a thermal bubble ink-jet device or a piezoelectrical ink-jet device.

9. The method as claimed in claim 1, wherein the ink is cured by at least one device selected from the group consisting of a heating device, a vacuum pump, and a light-exposure device.

10. The method as claimed in claim 9, wherein the light-exposure device is an ultraviolet light source.

11. The method as claimed in claim 1, wherein the UV light beams are emitted by a UV light source device; the UV light source device comprises a light source and the reflector, the light source and the reflector are located at one side of the substrate, and the reflector has a reflection surface inclining with respect to the top surface of the substrate; the UV light source emits light beams perpendicular to the top surface of the banks, and reflected by the reflection surface to the banks on the substrate.

12. The method as claimed in claim 1, wherein the UV light beams are emitted by two UV light source devices disposed at the two opposite sides of the substrate.

13. The method as claimed in claim 1, wherein the UV light beams are emitted by a UV light source device, the UV light source device comprises a UV light source, the reflector and a light screen, the reflector comprising an arc-shaped reflection surface facing the substrate and the banks and configured for reflecting the light beams to the banks; the UV light source is located between the reflector and the banks, and the light screen is located between the UV light source and the banks and is configured for blocking the light emitted from the UV light source.

14. The method as claimed in claim 13, wherein the light screen has a size equal to or larger than the substrate, and is configured for obstructing light beams emitted from the UV light source or reflected by the reflection surface from being irradiated perpendicularly; the reflector mantles over the light screen.

* * * * *